(12) United States Patent
Cho et al.

(10) Patent No.: US 7,494,604 B2
(45) Date of Patent: *Feb. 24, 2009

(54) CURABLE THICK FILM PASTE COMPOSITIONS FOR USE IN MOISTURE CONTROL

(75) Inventors: Yong Cho, Seoul (KR); Jay Robert Dorfman, Durham, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/053,845

(22) Filed: Mar. 24, 2008

(65) Prior Publication Data

US 2008/0171801 A1    Jul. 17, 2008

Related U.S. Application Data

(62) Division of application No. 10/970,520, filed on Oct. 21, 2004, now Pat. No. 7,371,335.

(51) Int. Cl.
*H01J 7/18* (2006.01)
*H01J 7/00* (2006.01)
*H01J 9/38* (2006.01)
*H01K 1/56* (2006.01)
*C03C 19/00* (2006.01)

(52) U.S. Cl. .............. 252/181.6; 252/181.7; 252/181.1; 252/194; 501/14; 501/15; 501/16; 501/17; 501/121; 501/32; 501/77; 445/41

(58) Field of Classification Search ................ 252/181.6
See application file for complete search history.

(56) References Cited

U.S. PATENT DOCUMENTS

| | | | |
|---|---|---|---|
| 1,626,682 A | 5/1927 | MacRae | |
| 2,760,863 A | 8/1956 | Plambeck, Jr. | |
| 2,850,445 A | 9/1958 | Oster | |
| 2,875,047 A | 2/1959 | Oster | |
| 3,074,974 A | 1/1963 | Gebura | |
| 3,097,096 A | 7/1963 | Oster | |
| 3,097,097 A | 7/1963 | Oster et al. | |
| 3,145,104 A | 8/1964 | Oster et al. | |
| 3,380,831 A | 4/1968 | Cohen et al. | |
| 3,427,161 A | 2/1969 | Lairdon et al. | |
| 3,479,185 A | 11/1969 | Chambers, Jr. | |
| 3,549,367 A | 12/1970 | Chang et al. | |
| 4,035,320 A * | 7/1977 | Lawson | 525/32.1 |
| 4,151,055 A * | 4/1979 | Stueben et al. | 522/121 |
| 4,162,162 A | 7/1979 | Dueber | |
| 4,615,560 A | 10/1986 | Schaller | |
| 4,771,085 A | 9/1988 | Lazaridis | |
| 5,051,654 A * | 9/1991 | Nativi et al. | 313/506 |
| 5,141,915 A * | 8/1992 | Roenigk et al. | 503/227 |
| 5,244,707 A | 9/1993 | Shores | |
| 5,401,706 A | 3/1995 | Fischer | |
| 5,591,379 A | 1/1997 | Shores | |
| 5,612,153 A * | 3/1997 | Moulton et al. | 429/304 |
| 5,965,256 A * | 10/1999 | Barrera | 428/354 |
| 5,998,325 A * | 12/1999 | Shepodd | 502/151 |
| 6,090,866 A | 7/2000 | Kranig et al. | |
| 6,226,890 B1 | 5/2001 | Boroson et al. | |
| 6,365,245 B2 * | 4/2002 | Blinka et al. | 428/35.7 |
| 6,943,202 B2 * | 9/2005 | Zhu et al. | 522/90 |
| 7,338,622 B2 * | 3/2008 | Dorfman | 252/511 |
| 2004/0012332 A1 | 1/2004 | Sasatani et al. | |
| 2005/0121665 A1* | 6/2005 | Gillissen et al. | 257/40 |

FOREIGN PATENT DOCUMENTS

| | | |
|---|---|---|
| DE | 4434171 A1 | 3/1996 |
| EP | 0223086 A | 5/1987 |
| EP | 1538170 A | 6/2005 |
| WO | WO 02/43098 A1 | 5/2002 |
| WO | WO 03/080235 A1 | 10/2003 |
| WO | WO2005/066977 A | 7/2005 |

OTHER PUBLICATIONS

D.W. Breck, Zeolite Molecular Sieves, Structure, Chemistry, and Use, John Wiley and Sons, New York, pp. 133-177, 1974.
Patent Abstracts of Japan, vol. 2000, No. 23, Feb. 10, 2001 & JP 2001 163931 A (Three Bond Co Ltd), Jun. 19, 2001.
Khan M. A. et al., "Effect of Additives in the Improvement of Hessian Cloth by UV-Induced Copolymerization", Radiation Physics and Chemistry, Elsevier Science Publishers BV., Amsterdam, NL., vol. 48, No. 3, Sep. 1996 pp. 337-342, XP004051504.

* cited by examiner

*Primary Examiner*—Joseph D Anthony

(57) ABSTRACT

The invention is directed to a thick film getter composition comprising: (a) desiccant material; dispersed in (b) organic medium comprising (1) curable organic polymeric binder; (2) monomer; and (3) photoinitiator.

6 Claims, No Drawings

CURABLE THICK FILM PASTE COMPOSITIONS FOR USE IN MOISTURE CONTROL

This application is a divisional application of pending allowed U.S. patent application Ser. No. 10/970,520 filed on Oct. 21, 2004.

FIELD OF THE INVENTION

The invention is directed to curable thick film getter paste compositions for use in controlling moisture. In one embodiment, the curable thick film getter paste is used for controlling moisture in moisture sensitive electronic devices.

BACKGROUND OF THE INVENTION

The invention describes a thick film getter composition for use in controlling moisture. Many environments are susceptible to unwanted moisture and this is especially so in the case of various electronic devices.

In an effort to control unwanted moisture, the concept of using a getter has been known for many years. Getters are substances which are added to a system or mixture to consume or inactivate traces of impurities.

One approach to minimizing the deleterious effects of moisture has involved the enclosure of moisture sensitive devices in a barrier to separate the active materials from oxygen and moisture. This approach has had some success, but it does not always adequately address the problems caused by even those small amounts of moisture trapped within the enclosure or diffusing into the enclosure over time.

The use of getters for controlling moisture within a sealed enclosure for an electronic component or device is well known. These sealed enclosures are designed to protect sensitive electronic components and devices from the outside environmental contaminants, including moisture. However, some electronic devices are highly sensitive to moisture and require moisture control to very low levels. At the same time, these electronic devices require that the getter composition be easily applied and processed while demonstrating that the processed composition sufficiently adheres to the desired substrate. The present invention provides a UV-curable composition to accommodate these requirements.

The prior art materials associated with getters and their use in electronic applications have been described below. Typically, the getter materials are not screen-printable compositions and are comprised of a desiccant material (i.e., zeolite, silica gel, etc.) and a binder. The binder may be organic or inorganic. The following illustrate the state of the prior art.

U.S. Pat. No. 5,244,707 to Shores discloses a sealed enclosure of an electronic device which incorporates a coating or adhesive with desiccant properties. The coating or adhesive comprises a protonated alumino silicate powder dispersed in polymer.

U.S. Pat. No. 5,591,379 to Shores teaches a composition of matter useful as a desiccant in a hermetic electronic device, comprising a powder dispersed in a binder, wherein said powder is selected from the group consisting of zeolite molecular sieves, activated alumina, silica gel, alkaline earth oxide, and alkali metal carbonate; said binder is a continuous matrix of porous glass or porous ceramic; and said powder to binder volume ratio is 0.001-2. The glasses disclosed for use as a binder must be made porous by creating channels for water vapor to penetrate. This may be done by various techniques known in the art, such as the use of blowing agents, fast evaporation of water or other gases during formation, fast decomposition of metalloorganic polymers and low temperature or incomplete sintering.

U.S. Pat. No. 1,626,682 to MacRae discloses a multi-pixel flat panel display means which include spaced apart first and second electrodes, with a patterned solid material layer in contact with one of the electrodes, exemplarily between the two electrodes. The patterned layer (the web) includes a multiplicity of apertures, with at least one aperture associated with a given pixel. In the aperture is disposed a quantity of a second material, exemplarily, a phosphor in the case of a flat panel field emission display, or a color filter material in the case of a liquid crystal display. The web can facilitate second material deposition by means of screen-printing. The web also can facilitate provision of spacer structure between two electrodes, and can include getter or hygroscopic material.

U.S. Pat. No. 5,401,706 to Fischer teaches a process for making a desiccant-coated substrate capable of being used at temperatures over 150 degrees Fahrenheit, the desiccant being in the form of particles and the particles having pores and being adhered to the substrate by a binder, the coated substrate being sufficiently flexible and the coating having sufficient adherence to the substrate so that the coated substrate can be formed into corrugated shapes, the desiccant particles in the coated substrate having at least 60% of their original adsorption capacity and the binder having good breathability; said process comprising the steps: (a) forming an aqueous suspension comprising particles of one or more desiccants, a water-based organic binder, a suspending agent to help maintain the desiccant particles in suspension, and an organic pore-clearing agent at least some of which enters at least some of the pores of the desiccant particles; (b) depositing the suspension on the substrate; and (c) causing the binder of the deposited suspension to set so that the deposited desiccant particles adhere to the substrate and causing at least some of the pore-clearing agent to leave the pores of the desiccant particles to prevent the binder from occluding at least some of the pores of the adhered desiccant particles, thereby to form a desiccant-coated substrate capable of being used at temperatures over 150 degrees Fahrenheit and of sufficient flexibility and having a coating having sufficient adherence to the substrate so that the desiccant-coated substrate can be formed into corrugated shapes and in which the desiccant particles in the coated substrate have at least 60% of their original adsorption capacity and in which the binder has good breathability.

U.S. Pat. No. 6,226,890 to Boroson et. al, teaches a method of desiccating an environment surrounding a moisture-sensitive electronic device sealed within an enclosure. Boroson clearly states that the following desiccants will not "function effectively with highly moisture-sensitive devices at a humidity level lower than 1000 ppm:" alumina, bauxite, calcium sulfate, clay, silica gel, zeolite, molecular sieves, and activated alumina.

U.S. Pat. No. 4,771,085 to Lazaridis, describes the use of curable dielectric compositions in membrane touch switch type circuits where adhesion to flexible substrates is required.

The inventors of the present invention desired to create a thick film getter composition capable of controlling humidity levels to below about 1000 ppm while at the same time allowing quick processing speeds, of about 5 seconds, and low processing temperatures.

The present invention provides curable thick film getter composition(s), method(s) of controlling moisture, and article(s) formed from those compositions and/or methods which may be used in moisture sensitive devices, including electronic devices which often require humidity control to levels below about 1000 ppm and sometimes below even 100 ppm. Furthermore, it allows for high speed processing of the getter composition and does not require high firing temperatures, rather the composition may be cured by exposure to actinic radiation, including ultraviolet radiation.

SUMMARY OF THE INVENTION

The invention is directed to a thick film getter composition comprising: (a) desiccant material; dispersed in (b) organic medium comprising (1) curable organic polymeric binder; (2) monomer; and (3) photoinitiator. The composition may processed at a time and energy sufficient to facilitate photopolymerization of said monomer.

The invention is further directed to method(s) of moisture control using such compositions and to articles formed from such methods and/or compositions.

DETAILED DESCRIPTION OF INVENTION

The thick film getter composition of the present invention is a curable ceramic composition, which may be formed on a substrate. For example, a glass substrate acting as a lid in various electronic display devices. The thick film getter acts as a water-absorbent at various environmental conditions of a few thousand ppm to a few ppm of humidity levels. The present invention is not limited to display device applications, but can be used for any other microelectronic device applications where the device lifetime can be degraded by or sensitive to the presence of moisture.

The thick film getter composition of the present invention may be cured by exposure to actinic radiation. "Actinic radiation" means light rays, violet and ultraviolet light, X-rays, or other radiations by which chemical changes are produced. Essentially, the composition is processed at a time and energy sufficient to initiate photopolymerization/curing of the monomer. The thick film getter of the present invention when cured demonstrates good densification and compatibility, particularly, with glass lid substrates associated with display device applications. The thick film getter paste is primarily intended to be used for various display applications including organic light emitting diodes (OLED) and electroluminescence (EL), where lifetime of the display devices are strongly related to the control of humidity and other harmful gases. The display applications differ from other hermetic microelectronic devices in that the moisture getter is working at highly moisture-sensitive or gas-sensitive environments. The display devices often require humidity control to levels below about 1000 ppm and sometimes below even 100 ppm.

The main components of the thick film getter composition are a desiccant powder dispersed in an curable organic medium. Usually, the desiccant material is the main functional part of the thick film getter, which determines its performance of water absorption. Generally, the capacity of water absorption proportionally depends on the relative content of the desiccant material.

The thick film getter composition, as described herein, is bonded to substrate by depositing the thick film composition onto the substrate and curing the thick film. Depending on device structure and required performance, thickness of the getter film may be controlled by the sequential depositions of the paste. A typical thickness of the thick film getter after single printing and curing ranges from 10 µm to 30 µm. An excessive thickness does not need to be considered as long as strong absorption of moisture is required.

Although screen-printing is expected to be a common method for the deposition of thick film getters, any other conventional methods including stencil printing, syringe dispensing or other deposition or coating techniques may be utilized.

This invention is based on the finding that thick film getter compositions (sometimes referred to as "pastes") can be made by combining desiccant material in a curable organic medium. The composition of the invention is described in further detail below.

Inorganic Composition: The inorganic composition of a thick film getter paste is comprised of a desiccant material dispersed in organic medium. Various desiccant materials such as molecular sieves (or zeolites), alkaline earth metal oxides, metal oxides, sulfates, chlorides, bromides may be selected for getter paste applications. Various types of zeolites are known to be the best candidates in terms of capacity of water absorption due to the intrinsic nature of their porous structure.

Zeolites are materials that absorb moisture by physical absorption and may be naturally or synthetically derived. Natural zeolites are hydrated silicate of aluminum and either sodium or calcium or both, of the type $Na_2O$, $Al_2O_3$, $xH_2O$, and $xSiO_2$. Synthetic zeolites are made either by a gel process or a clay process, which forms a matrix to which the zeolite is added. Both natural and synthetic zeolites may be used in the present invention. Well known zeolites include chabazite (also referred to as zeolite D), clinoptilolite, erionite, faujasite (also referred to as zeolite X and zeolite Y), ferrierite, mordenite, zeolite A, and zeolite P. Detailed descriptions of the above-identified zeolites, as well as others, may be found in D. W. Breck, Zeolite Molecular Sieves, John Wiley and Sons, New York, 1974, hereby incorporated by reference. For example, type 3A, 4A and 13X zeolites all have the ability to adsorb water molecules and are presently preferred as the adsorbent molecular sieve for making the new moisture getters. Such zeolites comprise $Na_2O$, $Al_2O_3$ and $SiO_2$. Certain adsorbent getters can adsorb gaseous contaminants in addition to moisture, such as gaseous $H_2$ and $O_2$. An example of a commercially available, solid getter tablet based on zeolite technology that can be made to adsorb organics, as well as moisture is described in European Patent Application No. WO 02/430098 A1 by Synetix.

The amount of desiccant material added to the composition should be determined based on the necessary capacity to absorb moisture, as dictated by the application. The approximate relative weight % of desiccant to organic vehicle ranges from 10 to 65.

Organic Medium: The organic medium in which the desiccant materials are dispersed is comprised of one or more curable organic polymeric binders, (including polymers, copolymers, oligomers and mixtures thereof), one or more photosensitive monomers, and various photochemicals (photoinitiators), the function of the latter is to facilitate the photo process and initiate a photopolymerization of the monomer. Additional additives, such as stabilizers, antifoaming agents, adhesion agents, and others known to those skilled in the art, may be added to the organic medium. There is typically no conventional organic solvent present.

Organic Polymeric Binders: The curable organic polymeric binders of the present invention may be polymers, copolymers, oligomers or mixtures thereof. The organic polymeric binders present in the organic medium may be selected from acrylates, methacrylates, urethane acrylates, epoxy acrylates and mixtures thereof, as well as, other like polymeric binders.

Monomer(s): The monomer or monomers of the present invention are selected from acrylate monomers, methacrylate monomers, and mixtures thereof.

Monomers useful in the present invention include triethylolpropane ethoxy triacrylate, t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethyacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. Nos. 3,380,831, 2,2-di(p-hydroxy-phenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryl-oxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene.

Photoinitiator(s): The photoinitiator(s) present in the organic medium are those which are thermally inactive, but which generate free radicals upon exposure to actinic radiation. Typical photoinitiators are disclosed in U.S. Pat. No. 4,615,560 to Dueber et al., herein incorporated by reference.

These photoinitiators include the substituted or unsubstituted polynuclear quinones which are compounds having two intracyclic carbon atoms in a conjugated carbocyclic ring system, e.g., 2-benzyl-2-(dimethylamino)-1-(4-morpholinophenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthracene-5,12-dione, and 1,2,3,4-tetra-hydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; alpha-hydrocarbon-substituted aromatic acyloins, including alpha-methylbenzoin, alpha-allylbenzoin and alpha-phenylbenzoin, thioxanthone and/or thioxanthone derivatives and the appropriate hydrogen donors. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162.

In one embodiment, the organic medium is Product Number 5017A by E.I. Du Pont de Nemours and Company. In yet another embodiment, the organic medium is Product Number 5018A by E.I. Du Pont de Nemours and Company.

The ratio of organic medium in the thick film composition to the inorganic solids in the dispersion is dependent on the method of applying the paste and the kind of organic medium used, and it can vary. Usually, the dispersion will contain 10-65 weight % of inorganic solids and 35-90 weight % of vehicle in order to obtain good coating. Within these limits, it is desirable to use the least possible amount of binder vis-à-vis solids in order to reduce the amount of organics and to obtain better quality of thick film. The content of the organic medium is selected to provide suitable consistency and rheology for casting, printing, such as silk screen printing or ink-jet printing, or coating by spraying, brushing, syringe-dispensing, doctor blading, and the like.

In addition, the proportion of dispersing organic medium in the getter paste may control the thickness of the solidified layer of absorbent getter. For example, a thick film paste with minimized organic medium results in formation of a thicker getter layer (such dispersions are subject to shear-thinning and hence become thinner as the dispersion is worked on the surface).

Application of Thick Films: The thick film getter is typically deposited on a substrate, such as glass, low temperature co-fired ceramics (LTCC) or silicone, that is impermeable to gases and moisture. The substrate can also be a sheet of flexible material, such as an impermeable plastic such as polyester, for example polyethylene terephthalate, or a composite material made up of a combination of plastic sheet with optional metallic or dielectric layers deposited thereupon. In one embodiment, the substrate can be transparent (or semi-transparent) to enable light to enter into the encapsulated region or to enable light to be emitted from the encapsulated region through the substrate.

The deposition of the thick film getter is performed preferably by screen printing, although other deposition techniques such as stencil printing, syringe dispensing or coating techniques can be utilized. In the case of screen-printing, the screen mesh size controls the thickness of deposited thick film.

The deposited thick film is cured by exposure to actinic radiation. The composition provides a method of moisture control as described above wherein the getter composition is applied to a substrate and processed to cure the composition, thus forming a substrate with a cured getter composition adhered thereto. The method may further comprise sealing the cured getter composition within an enclosure wherein the substrate is one boundary of the enclosure. These methods form articles that control moisture. For example, the article may be a moisture sensitive electronic device, such as an electronic display device.

The composition may be cured by UV exposure, for example, UV exposure for about 1-5 seconds in an UV belt furnace. The flux density of UV light is typically 300-950 $mJ/cm^2$. The thickness of cured thick films ranges from 10 μm to 30 μm. To prevent readsorption of volatiles (and de-activation of the zeolite), the curing step is often conducted in a controlled atmosphere void of moisture and other gases, such as under vacuum. The curing step is usually performed immediately prior to sealing the device into the hermetic container unless the cured getter is stored in an atmosphere void of moisture and/or other gases. Depending on processing procedure, an additional firing at 100-250° C. for activation of the getter may be required to evaporate absorbed moisture.

The humidity sensitivity of fired getter thick films was evaluated by exposing the getter composition to changing humidity conditions, such as different humidity levels, exposure time, and temperature. The thermal gravimetric analysis (TGA) analysis was used to quantify the weight loss up to a certain temperature. The TGA evaluation results showed the identical increasing tendency of weight loss with increasing the content of desiccant material. Weight loss up to about 250° C. corresponds mostly to absorbed moisture in the cured getter. Weight loss above 300° C. up to 500° C. results dominantly from the volatilization of organic vehicle.

The present invention will be discussed in further detail by giving practical examples. The scope of the present invention, however, is not limited in any way by these practical examples.

EXAMPLES 1-10

Thick film getter paste was prepared by mixing desiccant material (13x-typed molecular sieve powder) with an average particle size of 2 μm with curable organic media commercially-available from E.I. du Pont de Nemours and Company. Two DuPont products, 5017A and 5018A were used in this experiment. Table 1 represents the examples of thick film compositions containing 20-58% molecular sieve. Different levels of desiccant relative to organic media were applied for optimized performance. Changing the content of solvent was necessary to adjust paste viscosity and film thickness for different deposition methods.

The getter paste was printed using a 200 mesh screen on a glass lid substrate based on soda-lime silicates and UV-treated exposure for about 2 seconds in an UV belt furnace. The intensity of UV light was 920 mJ/cm². The thickness of cured thick film ranged from 10 μm to 30 μm, depending on the content of desiccant and screen mesh size.

The thick film cured dense and showed good adhesion with the glass substrate. No cracking or blistering was observed on the surface of fired thick films. Good thickness uniformity of fired film was kept within +/−3 μm regardless of paste composition.

Fired thick film samples were evaluated to quantify the degree of moisture absorption after exposure to certain humidity environment. Table 2 shows the absorption performance of selected getter samples based on the thermal gravimetric analysis (TGA) results. The absorption results were expressed as weight loss % of thick films up to a given temperature. All TGA samples in Table 2 were prepared by exposing to an 85° C./85% RH humidity condition for 1 hour.

The moisture absorption of the getter paste was found to depend strongly on temperature and relative content of molecular sieve as seen in the examples. Particularly, increasing the content of molecular sieve tended to increase the percentage of weight loss. For example, a weight loss of 11% was detected for the sample containing 50% glass according to TGA up to 200° C., while only 5% weight loss for the 20% glass composition. This tendency is reasonable when considered the fact that the absorption capability is dominantly determined by the relative content of desiccant materials.

Table 2 also compares two UV-organic media, 5017A vs. 5018A, as the content of molecular sieve increases. Since 5018A contains an inorganic ingredient originally incorporated to boost adhesion, there was an upper limit on the maximum content of molecular sieves that can be added. Accordingly, examples 8 and 9 were too thick to be screen-printed with a common printing technique.

Example 10 contained no desiccant material, only UV-organic media, 5018A. Example 10 showed a lower weight loss for up to 300° C. compared to 29% molecular sieve-containing paste (Example 7) as seen in Table 2. This is the effect of moisture absorption from molecular sieve. The volatilization of UV organics is responsible for the higher weight losses above 300° C.

Tables 3 and 4 represent weight losses of Examples 1-5 after re-firing UV getter pastes at 100° C. and 200° C., respectively. The re-firings were intended to simulate a potential activation process designed for desorption of moisture prior to device sealing. There is no significant difference in weight loss after re-firing at 100° C. but re-firing at 200° C. tends to show overall decrease of weight loss values. The decrease indicates that the desorption can happen more effectively at a higher temperature and the moisture absorption is a reversible process.

TABLE 1

Thick film getter composition in weight %

| Ex. # | 1 | 2 | 3 | 4 | 5 | 6 | 7 | 8 | 9 | 10 |
|---|---|---|---|---|---|---|---|---|---|---|
| 13x | 20 | 23 | 26 | 33 | 43 | 50 | 29 | 50 | 58 | — |
| 5017A | 80 | 76 | 74 | 67 | 57 | 50 | — | — | — | — |
| 5018A | — | — | — | — | — | — | 71 | 50 | 42 | 100 |

TABLE 2

Weight loss in % of thick film pastes without activation

| Ex. # | 1 | 2 | 3 | 4 | 5 | 6 | 7 | 10 |
|---|---|---|---|---|---|---|---|---|
| Up to | 2.0 | 2.0 | 2.5 | 2.5 | 3.0 | 4.0 | 3.0 | 1.0 |
| Up to | 5.0 | 5.0 | 5.0 | 6.0 | 9.3 | 11. | 8.0 | 1.5 |
| Up to | 13. | 12. | 12. | 13. | 15. | 17. | 11. | 7.5 |
| Up to | 48. | 48. | 46. | 43. | 40. | 62. | 29. | 43. |
| Up to | 73. | 71. | 67. | 58. | 52. | 48. | 37. | 53. |

TABLE 3

Weight loss in % of thick film pastes after re-firing at 100° C.

| Ex. # | 1 | 2 | 3 | 4 | 5 |
|---|---|---|---|---|---|
| Up to 100° C. | 1.0 | 2.3 | 2.5 | 2.7 | 3.0 |
| Up to 200° C. | 3.5 | 5.0 | 5.5 | 6.5 | 9.0 |
| Up to 300° C. | 12.0 | 12.5 | 13.0 | 14.0 | 15.0 |

TABLE 4

Weight loss in % of thick film pastes after re-firing at 200° C.

| Ex. # | 1 | 2 | 3 | 4 | 5 |
|---|---|---|---|---|---|
| Up to 100° C. | 1.0 | 1.3 | 1.5 | 2.3 | 4.0 |
| Up to 200° C. | 3.0 | 3.0 | 3.5 | 7.0 | 8.5 |
| Up to 300° C. | 9.0 | 10.0 | 11.0 | 13.0 | 14.5 |

What is claimed is:

1. A method of using a thick film getter composition comprising providing a thick film getter composition consisting of:
   (a) desiccant material selected from the group consisting of zeolites, metal sulfates, metal chlorides, metal bromides, and mixtures thereof dispersed in
   (b) organic medium consisting of (1) curable organic polymeric binder; (2) monomer; and (3) photoinitiator selected from the group consisting of unsubstituted polynuclear quinones, substituted polynuclear quinones, vicinal ketaldonyl alcohols, alpha-hydrocarbon-substituted aromatic acyloins, phenazine dyes, oxazine dyes, quinine dyes, Michler's ketone, benzophenone and 2,4,5-triphenlimidazlyl dimers having hydrogen donor, wherein the weight percent of the desiccant ranges from 10 to 65 percent of the total composition and the weight percent of the organic medium ranges from 35 to 90 percent of the total composition, wherein the thick film getter composition has been processed at a time and energy sufficient to facilitate photopholymerization of said monomer to control moisture.

2. The method of claim 1 comprising controlling moisture in a moisture sensitive electronic device.

3. The method of claim 2 wherein the desiccant material comprises 10-65 weight percent of the total composition.

4. The method of claim 1, wherein the composition is capable of controlling humidity levels to below about 1000 ppm.

5. The method of claim 1, wherein the composition is capable of allowing quick processing speeds, of about 5 seconds.

6. The method of claim 3, wherein the composition is capable of allowing quick processing speeds, of about 5 seconds, and low processing temperatures.

* * * * *